United States Patent [19]

Verber

[11] Patent Number: 4,712,089
[45] Date of Patent: Dec. 8, 1987

[54] ALL-OPTICAL A/D CONVERSION USING INTEGRATED NONLINEAR GUIDED WAVE OPTICAL CIRCUITRY

[75] Inventor: Carl M. Verber, Columbus, Ohio

[73] Assignee: Battelle Memorial Institute, Columbus, Ohio

[21] Appl. No.: 786,770

[22] Filed: Oct. 11, 1985

[51] Int. Cl.[4] .............................................. H03M 1/36
[52] U.S. Cl. ........................ 340/347 AD; 340/347 M; 356/222; 356/230
[58] Field of Search .................. 340/347 AD, 347 M; 356/222, 230

[56] References Cited

U.S. PATENT DOCUMENTS 3,599,545 8/1971 Durr et al. ...................... 356/235 X
3,864,529 2/1975 Tracey et al. ....................... 375/20
3,964,064 6/1976 Brandao et al. ............. 343/5 DP X

FOREIGN PATENT DOCUMENTS 52-42357 4/1977 Japan ........................... 340/347 AD

OTHER PUBLICATIONS

Nordstrom, High-Speed Integrated A/D Converter, 1976 IEEE International Solid-State Circuits Conference, p. 150.

The Engineering Staff of Analog Devices, Inc., Analog-Digital Conversion Handbook, 6/1972, pp. II-12 to II-17; II-52 to II-54.

Primary Examiner—T. J. Sloyan
Attorney, Agent, or Firm—Philip M. Dunson

[57] ABSTRACT

Methods and apparatus for all-optical analog to digital conversion. An analog optical input signal is directed along a path comprising a series of level sensing means for determining whether its intensity is above or below a threshold value. The optical signals from successive level sensing means are directed in pairs to optical exclusive-or gates to provide a digital optical signal to at least one of a plurality of individual optical output means according to a designated digital coding system whereby the optical digital indication corresponds to the sensed level of intensity of the analog optical input signal. Apparatus comprising channel waveguides and integrated optical devices provide economical systems for high-speed computation and other uses.

16 Claims, 13 Drawing Figures

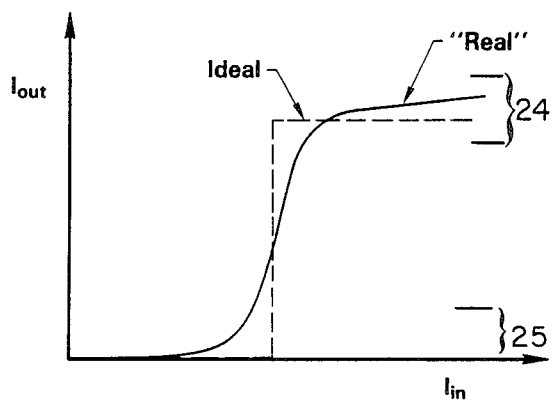
FIG. 3
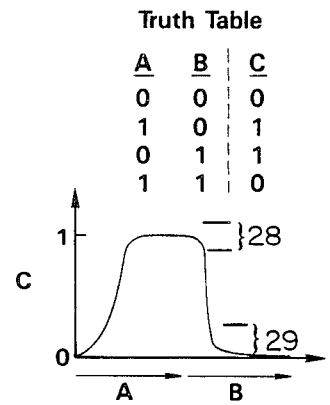
FIG. 4
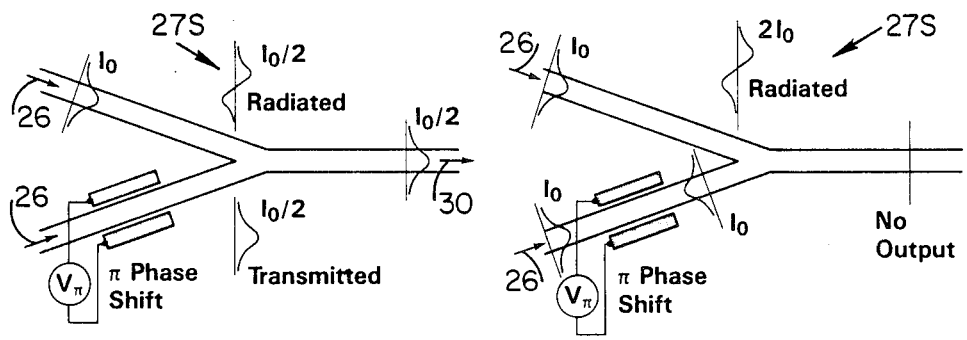
Input into one arm only
$I_0/2$ is transmitted into output arm
FIG. 5
Input into both arms
Only m=1 mode is excited
All energy is lost to radiation modes
FIG. 6
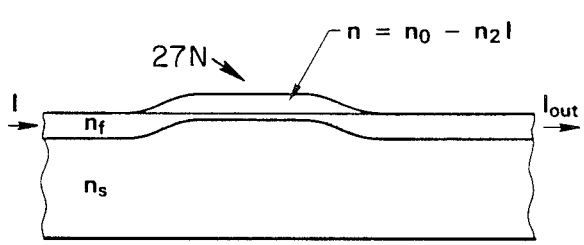
FIG. 7
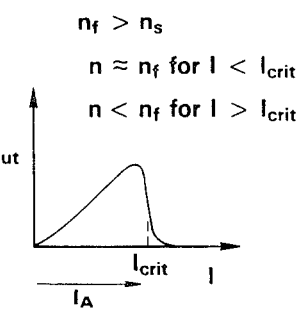
FIG. 8

$n_g > n_s$
$n < n_g$ for $I < I_{crit}$
$n > n_g$ for $I > I_{crit}$

Single-mode guide in $t_f$ region

Cut off in $t_r$ region for low intensities

Guides in $t_r$ region for high intensities

4,712,089

ALL-OPTICAL A/D CONVERSION USING INTEGRATED NONLINEAR GUIDED WAVE OPTICAL CIRCUITRY

This invention was made with Government support under Contract N 00014-85-K-0479 awarded by the Office of Naval Research. The Government has certain rights in this invention.

FIELD

This invention relates to the conversion of optical analog signals to optical digital signals. The invention has to do primarily with methods and apparatus for receiving an analog optical input signal and for providing a digital optical output signal indicative of the intensity of the analog input signal using optical devices only.

BACKGROUND

The present invention is related to the subject matter of the following U.S. patents and copending U.S. patent applications:
A. Richard P. Kenan and Carl M. Verber, Electrooptical Multipliers; U.S. Pat. No. 4,403,833, Sept. 13, 1983.
B. H. John Caulfield, Polynomial Evaluation; U.S. Pat. No. 4,544,230, Oct. 1, 1985.
C. Carl M. Verber, Optical Computation; U.S. Pat. No. 4,544,229, Oct. 1, 1985.
D. H. John Caulfield and William T. Rhodes, Optical Systolic Array Processing Ser. No. 450,153, filed Dec. 15, 1982. Now U.S. Pat. No. 4,567,569, issued Jan. 28, 1986.
E. Carl M. Verber and Richard P. Kenan, Array Multiplication; Ser. No. 481,184, filed Apr. 1, 1983, and Ser. No. 573,528, filed Jan. 24, 1984 (continuation in part). Now U.S. Pat. No. 4,595,994, issued June 17, 1986.

Said patents and applications are assigned to the assignee of the present invention. All of the patents and applications cited above and the other references cited herein are hereby incorporated hereinto by reference and made a part hereof the same as if fully set forth herein for purposes of indicating the background of the invention and illustrating the state of the art.

Except where otherwise indicated herein, the components employed in typical embodiments of the present invention are now well known. Convenient ways of making them are described in the above mentioned patents and applications and in the references cited therein and herein.

Optical computers offer advantages over electrical computers in speed of data processing and freedom from electrical interference. An important component of such computers and for the inputs to them is an analog to digital (A/D) converter. In the prior art, A/D converters for processing optical signals typically have required optical to electrical signal conversions as well as electrical to optical signal conversion. An all-optical A/D converter that avoids the intermediate conversion to electrical signals allows the full realization of the advantages of optical computation. This invention accomplishes all-optical A/D conversion.

DISCLOSURE

A typical all-optical analog to digital converter according to this invention comprises the important components shown in FIG. 1:
an analog input channel containing the light signal,
taps for removing equal amounts of light energy from the input channel,
optical threshold devices (or comparators) which pass a fixed light signal when the input light signal exceeds the threshold and minimal or no significant light signal when the input light signal is below the threshold,
a set of XOR gates,
a light distribution network, and
a set of binary light output channels.

For reasons of compactness, stability, and minimum power consumption, a preferred embodiment of this invention involves an integrated optical design in which light signals are directed through channel waveguides.

For simplicity, the operation of a 3-bit all-optical A/D converter is shown in FIG. 1 with 8 taps for 3-bit output. However, the invention is broadly applicable to N-bit output using $2^N$ taps. A light pulse of analog intensity I traveling from left to right in the analog input channel passes a series of taps in succession. The taps comprise short lengths of parallel channel waveguide which extract light from the input light beam in the analog channel by evanescent coupling. Each tap in succession extracts a fixed amount of light from the input signal, thus reducing the intensity of the remaining light.

The light collected by each tap is channelled to a threshold discrimator which passes light of intensity above a preselected threshold intensity and does not pass light below the preselected threshold intensity. The light signal (or absence of light) from adjacent threshold discriminators is split and enters the input arms of adjacent XOR gates the outputs of which are connected by distribution channels to the binary output channels.

The currently preferred embodiment of the invention is illustrated in FIG. 2, and is described in detail in the section on CARRYING OUT THE INVENTION.

DRAWINGS

FIG. 3 is a graph showing ideal and typical characteristics of output versus input for typical threshold devices useful in apparatus as in FIGS. 1 and 2.

FIG. 4 is a graph showing typical properties of output versus input for typical exclusive or (XOR) gate devices useful in apparatus as in FIGS. 1 and 2.

Figure 1:
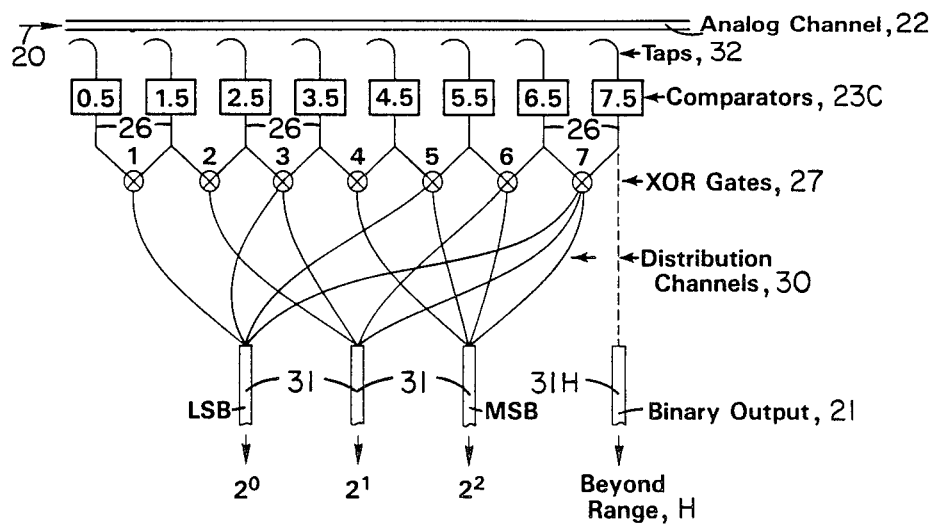
FIG. 1 is a schematic plan view of typical apparatus according to the present invention.
Figure 2:
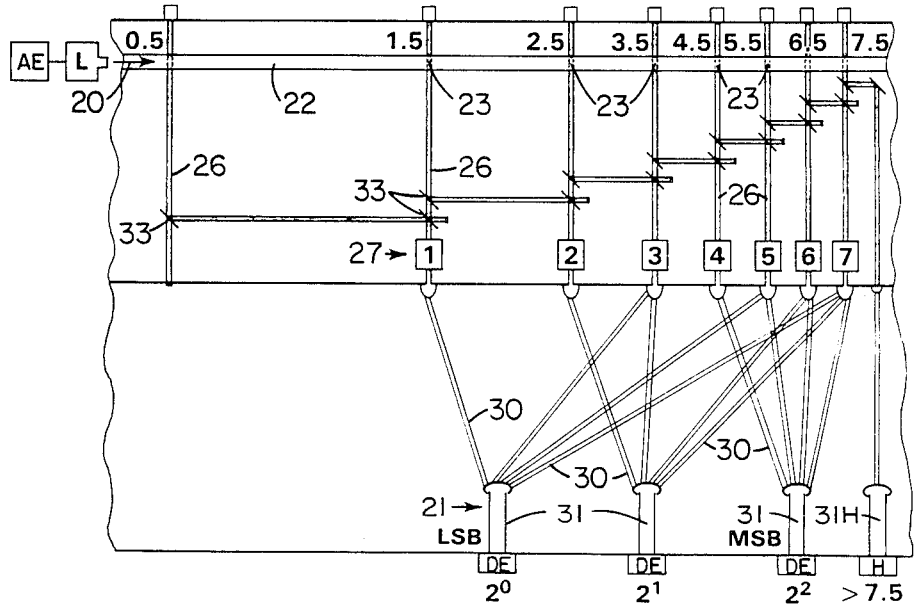
FIG. 2 is a schematic plan view of typical, and currently preferred, apparatus according to the invention.

FIG. 5 a schematic plan view showing a typical single-mode channel waveguide XOR gate device useful in apparatus as in FIGS. 1 and 2, and illustrating its operation with a binary input combination of 1,0 or 0,1.

FIG. 6 is a view similar to FIG. 5, modified to illustrate the operation of the device with a binary input combination of 1,1.

FIG. 7 is a schematic sectional view of a nonlinear waveguide XOR gate device having negative nonlinearity and useful in apparatus as in FIGS. 1 and 2.

FIG. 8 is a graph showing typical properties of output versus input for an XOR gate device as in FIG. 7.

Figure 9:
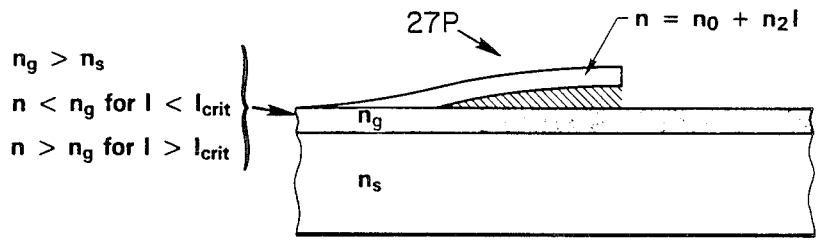

FIG. 9 is a schematic sectional view of a nonlinear waveguide XOR gate device having positive nonlinearity, and useful in apparatus as in FIGS. 1 and 2.

Figure 10:
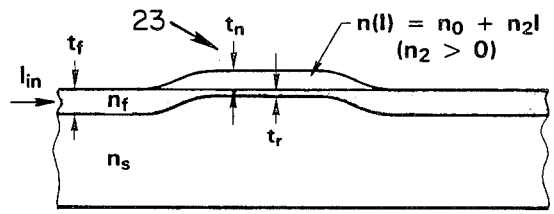

FIG. 10 is a schematic sectional view of a typical nonlinear waveguide threshold device useful in apparatus as in FIGS. 1 and 2.

Figure 11:
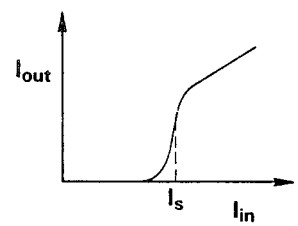

FIG. 11 is a graph showing typical characteristics of output versus input for a threshold device as in FIG. 10.

Figure 12:
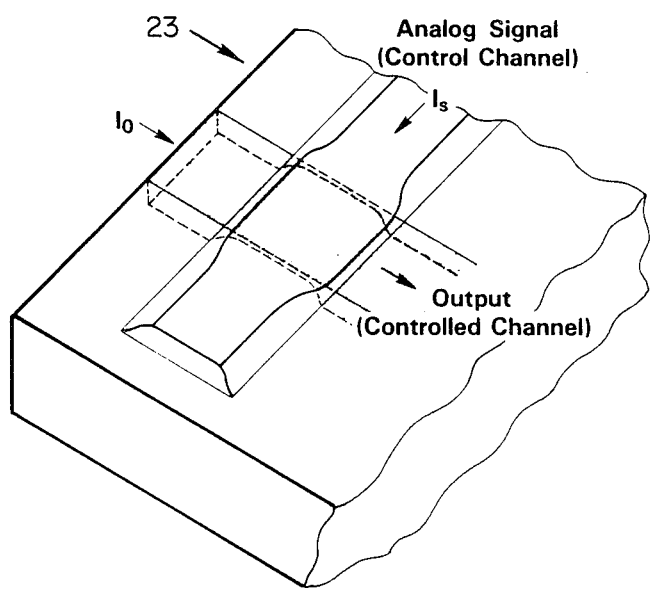

FIG. 12 is a schematic perspective view of a typical threshold device with orthogonal channels useful in apparatus as in FIG. 2.

Figure 13:
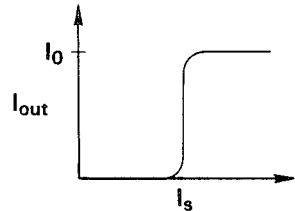

FIG. 13 is a graph showing typical characteristics of output versus input for a threshold device as in FIG. 12.

CARRYING OUT THE INVENTION

Referring now especially to FIGS. 1 and 2, typical methods and apparatus according to the present invention, for receiving an analog optical input signal 20 and for providing a digital optical output signal 21 indicative of the intensity of the analog input signal 20, comprises the steps of and means for:

directing the analog optical input signal 20 along a path 22 comprising a series of level sensing means 23 (such as the threshold devices 23 shown in FIGS. 2,10, and 12, or the evanescent couplers 23C, called comparators in FIG. 1) for determining whether the intensity of the analog input signal 20 is above a predetermined threshold and for providing a first binary optical threshold signal of a first predetermined intensity within a first predetermined range of intensities 24 (FIG. 3) when the intensity of the analog signal 20 is above the threshold, and for providing a second binary optical threshold signal of a second predetermined intensity within a second predetermined range of intensities 25 (FIG. 3) substantially separated (lower in FIG. 3) from the first range 24 when the intensity of the analog input signal is not above the threshold;

the first level sensing means 23 providing a signal, 26, in the range 24 or 25, indicating whether the intensity of the input signal 20 is greater than a first (lowest) designated intensity (0.5 in FIGS. 1 and 2), the second level sensing means 23 providing a signal 26 indicating whether the intensity of the input signal is greater than a second (next to the lowest) designated intensity (1.5 in FIGS. 1 and 2), the third level sensing means 23 providing a signal 26 indicating whether the intensity of the input signal is greater than a third (next higher, ie next to the next lowest) designated intensity (2.5 in FIGS. 1 and 2), the fourth level sensing means 23 providing a signal 26 indicating whether the intensity of the input signal is greater than a fourth (next higher) designated intensity (3.5 in FIGS. 1 and 2), and so on to the last level sensing means 23 providing a signal 26 indicating whether the intensity of the input signal is greater than a last (highest) designated intensity (7.5 in FIGS. 1 and 2);

directing a predetermined portion (typically one-half) of the threshold signals 26 from the first and second level sensing means 23 to first exclusive-or gate (XOR) means 27(1), directing a predetermined portion (typically one-half) of the threshold signals 26 from the second and third level sensing means 23 to second XOR means 27(2), directing a predetermined portion (typically one-half) of the threshold signals 26 from the third and fourth level sensing means 23 to third XOR means 27(3), and so on, directing a predetermined portion (typically one-half) of the threshold signals 26 from the next-to-last and last level sensing means 23 to a last XOR means 27(7) (in number one less than that of the last level sensing means);

each XOR means 27 comprising means for providing a first binary optical signal 30 (high) (indicating inequality) of a third predetermined intensity within a third predetermined range of intensities 28 (FIG. 4) when one of the threshold signals 26 (A or B in FIG. 4) directed to it (27) has the first predetermined intensity 24 and the other threshold signal 26 (B or A in FIG. A) directed to it (27) has the second predetermined intensity 25, and for providing a second binary optical signal 30 (low) (indicating equality) of a fourth predetermined intensity within a fourth predetermined range of intensities 29 (FIG. 4) substantially separated (lower in FIG. 4) from the third range 28 when both of the threshold signals 26 (A and B in FIG. 4) directed to it (27) have the first predetermined intensity 24 and when both of the threshold signals 26 (A and B in FIG. 4) directed to it (27) have the second predetermined intensity 25; and directing the digital optical signal 30 from each XOR means 27 to at least one of a plurality of individual optical output means 31 according to a designated digital coding system, whereby each available combination of signals in the plurality of individual output means 31 provides a digital indication (at $2^0$, $2^1$, $2^2$) of the specific range of optical intensities within which is the intensity of the analog optical input signal 20.

The apparatus of FIGS. 1 and 2 typically comprises also means for directing a predetermined portion (typically one-half) of the threshold signal 26 from the last level (highest) sensing means 23 to an additional individual optical output means 31H for providing an indication (at H) that the intensity of the analog optical input signal 20 is greater than the last (highest) designated intensity (7.5 in FIGS. 1 and 2).

The apparatus typically comprises also means L (such as a laser, FIG. 2) for receiving an analog electrical signal AE and providing an analog optical signal 20 having an intensity that is a monotonic function of the magnitude thereof (AE) as the input signal 20 to the input directing means 22; and means such as photodetectors (DE) means 22; and means such as photodetectors (DE) responsive to each individual optical output means 31,31H for providing an electrical signal indicating the level of intensity of the light received from each XOR means 27.

Typically the path 22 along which the analog input signal 20 is directed (as well as the other light directing means) comprises channel waveguide means 22 as in FIGS. 1 and 2.

Where the intensity of the analog input signal 20 decreases monotonically as it travels along the path 22, the level sensing means 23 typically comprise a series of threshold gate means 23 spaced apart along the path 22 and each having substantially the same threshold level, as in FIG. 2. The level sensing means may comprise either nonlinear waveguide threshold gate means 23 as in FIG. 10, or threshold gate means 23 with orthogonal channels as in FIGS. 2 and 12.

The XOR means 27 may comprise single-mode channel waveguide XOR gate means 27S as in FIGS. 5 and 6, or waveguide XOR gate means 27N having negative nonlinearity as in FIG. 7, or waveguide XOR gate means 27P having positive nonlinearity as in FIG. 9.

The path 22 along which the analog input signal 22 is directed may comprise channel waveguide means and a plurality of evanescent coupler means 32 (called taps in FIG. 1).

Typically each means for directing a portion of a threshold signal 26 comprises beam splitting means 33 (FIG. 2).

The threshold device and the XOR are two "active" devices that must be designed so that they can interact properly and so that they can be compatibly fabricated on the same substrate. There are several preferred characteristics for the threshold devices in this invention, such as

- sharp threshold characteristic,
- all devices identical for ease of fabrication,
- constant phase output (if single-mode Y junction XOR is used),
- constant "on" intensity,
- zero "off" intensity.

A number of factors must be considered in the design for an integrated optics implementation of the all-optical A/D, such as

- maintain reasonable overall size,
- provide suitably sharp thresholding action,
- maintain outputs from the threshold elements consistant with XOR requirements,
- aim for uniform loss in distribution network.

There are known integrated optical methods for implementing the XOR based upon the operation of the single-mode Y junction. An equivalent operation can be performed with collimated beams in a planar waveguide using a surface-grating beam splitter. In either case, a phase shifter is required to establish the $\pi$ phase shift required for the XOR operation. The required phase shift can be built into a passive waveguide either geometrically or by doping. However, the more common approach is to use an electrooptic waveguide and establish the required phase offset with a d.c. voltage as shown in FIGS. 5 and 6. In either case the inputs to the XOR must be mutually coherent.

An alternative to the single-mode Y junction is based on intensity-dependent guided wave phenomena. The relevant phenomena are discussed by Seaton, et al [Seaton, C. L., Stegemena, G. I., and Winful, H. G., "Intensity-Dependent Guided Wave Phenomena", SPIE Vol. 578 Integrated Optic Circuit Engineering II (1985), 143–149]. Seaton, et al, describe an approach to nonlinear devices in which the nonlinear properties of the waveguide make modal characteristics intensity dependent. This nonlinear waveguide approach was used to design XOR gates for the present invention as shown in FIGS. 7 and 8. The overlay material has a negative nonlinearity such that the index of refraction decreases with increasing intensity. The guide is designed to be just above cutoff for low intensities. As the intensity increases the index of refraction in the guide drops and it cuts off the mode and ceases to transmit.

An alternative XOR gate uses a material with positive nonlinearity as shown in FIG. 9.

A comparison of the characteristics and requirements of the two main types of XORs from a system design standpoint favors the more flexible nonlinear waveguide, other things being equal, as summarized below:

| PROPERTY | Y JUNCTION | NONLINEAR WAVEGUIDE |
| --- | --- | --- |
| INPUT: | | |
| WAVELENGTHS | IDENTICAL | CAN DIFFER |
| COHERENCE | REQUIRED | LARGLY IRRELEVANT |
| PHASE CONTROL | REQUIRED | LARGLY IRRELEVANT |

-continued

| PROPERTY | Y JUNCTION | NONLINEAR WAVEGUIDE |
| --- | --- | --- |
| MODE STRUCTURE | SINGLE | SINGLE, MULTI, OR PLANAR |

Various approaches can be considered for the optical threshold device such as variations of the nonlinear Fabry-Perot interferrometer. However, it is preferable to perform this function using a variant of the nonlinear waveguide.

The operation of a nonlinear waveguide threshold device 23 is shown in FIGS. 10 and 11, and its implementation with orthogonal channels 23 is shown in FIGS. 12 and 13. As shown in FIG. 10, a light signal $I_s$ of intensity I in the upper waveguide region $t_n$ changes the index of refraction 17 relative to the index of refraction $n_f$ in the lower guide region $t_r$. A separate light beam $I_{in}$ in FIG. 10 (called $I_o$ in FIG. 12) in the controlled channel $t_r$ is cut off (i.e. $I_{out}=0$ in FIG. 11) for low intensities of light signal I in control channel $t_n$ and guides (i.e. $I_{out}$ is proportional to $I_{in}$ in FIG. 11) for high intensities of light signal I in the control channel $t_n$.

FIG. 12 shows one of the typical threshold devices 23 with orthogonal channels. FIG. 13 shows that the output from the controlled channel ($I_{out}$) depends on the intensity of the original analog input signal 20, whose intensity is after attenuation along the control channel, at a series of orthogonal threshold devices 23 arranged as shown in FIG. 2.

The orthogonal threshold device 23 based on nonlinear waveguide principles for use in an all-optical A/D convertor as shown in FIG. 2 has several advantages over the embodiment shown in FIG. 1, such as:

- the functions of the light taps and comparators in FIG. 1 are combined in a single threshold device,
- the fabrication technologies for the threshold device and XOR device are similar,
- the optical digital output of the system is separate from the optical analog input,
- the flat output of the threshold device, which after beam splitting is the input to the XOR device, improves the operation of the latter device,
- since single mode channels are not required with nonlinear waveguides, the use of holographic optical elements as in FIG. 2 is an attractive option.

All-optical A/D converters in accordance with the present invention can serve several applications, such as

- output interface for high-speed analog optical computing devices,
- mixed-binary to binary converter for optical digital multiplication by analog convolution processors,
- interface for analog fiber links to sensor arrays.

They can, of course, be used with apparatus as in the patents and patent applications cited in the BACKGROUND section herein, to provide digital optical signals therefrom for further optical processing or to provide digital electrical outputs via photodetectors.

While the forms of the invention herein disclosed constitute presently preferred embodiments, many others are possible. It is not intended herein to mention all of the possible equivalent forms or ramifications of the invention. It is to be understood that the terms used herein are merely descriptive rather than limiting, and that various changes may be made without departing from the spirit or scope of the invention.

I claim:

1. A method for receiving an analog optical input signal and for providing a digital optical output signal indicative of the intensity of the analog input signal, comprising directing the analog optical input signal along a path comprising a series of level sensing means for determining whether the intensity of the analog input signal is above a predetermined threshold and for providing a first binary optical threshold signal of a first predetermined intensity within a first predetermined range of intensities when the intensity of the analog signal is above the threshold, and for providing a second binary optical threshold signal of a second predetermined intensity within a second predetermined range of intensities substantially separated from the first range when the intensity of the analog input signal is not above the threshold;

the first level sensing means providing a signal indicating whether the intensity of the input signal is greater than a first (lowest) designated intensity, the second level sensing means providing a signal indicating whether the intensity of the input signal is greater than a second (next to the lowest) designated intensity, the third level sensing means providing a signal indicating whether the intensity of the input signal is greater than a third (next higher, ie next to the next lowest) designated intensity, the fourth level sensing means providing a signal indicating whether the intensity of the input signal is greater than a fourth (next higher) designated intensity, and so on to the last level sensing means providing a signal indicating whether the intensity of the input signal is greater than a last (highest) designated intensity;

directing a predetermined portion of the threshold signals from the first and second level sensing means to first exclusive-or gate (XOR) means, directing a predetermined portion of the threshold signals from the second and third level sensing means to second XOR means, directing a predetermined portion of the threshold signals from the third and fourth level sensing means to third XOR means, and so on, directing a predetermined portion of the threshold signals from the next-to-last and last level sensing means to a last XOR means (in number one less than that of the last level sensing means);

each XOR means comprising means for providing a first binary optical signal (indicating inequality) of a third predetermined intensity within a third predetermined range of intensities when one of the threshold signals directed to it has the first predetermined intensity and the other threshold signal directed to it has the second predetermined intensity, and for providing a second binary optical signal (indicating equality) of a fourth predetermined intensity within a fourth predetermined range of intensities substantially separated from the third range when both of the threshold signals directed to it have the first predetermined intensity and when both of the threshold signals directed to it have the second predetermined intensity; and directing the digital optical signal from each XOR means to at least one of a plurality of individual optical output means according to a designated digital coding system, whereby each available combination of signals in the plurality of individual output means provides a digital indication of the specific range of optical intensities within which is the intensity of the analog optical input signal.

2. A method as in claim 1, comprising also directing a predetermined portion of the threshold signal from the last level sensing means to an additional individual optical output means for providing an indication that the intensity of the analog optical input signal is greater than the last (highest) designated intensity.

3. Apparatus for receiving an analog optical input signal and for providing a digital optical output signal indicative of the intensity of the analog input signal, comprising means for directing the analog optical input signal along a path comprising a series of level sensing means for determining whether the intensity of the analog input signal is above a predetermined threshold and for providing a first binary optical threshold signal of a first predetermined intensity within a first predetermined range of intensities when the intensity of the analog signal is above the threshold, and for providing a second binary optical threshold signal of a second predetermined intensity within a second predetermined range of intensities substantially separated from the first range when the intensity of the analog input signal is not above the threshold;

the first level sensing means providing a signal indicating whether the intensity of the input signal is greater than a first (lowest) designated intensity, the second level sensing means providing a signal indicating whether the intensity of the input signal is greater than a second (next to the lowest) designated intensity, the third level sensing means providing a signal indicating whether the intensity of the input signal is greater than a third (next higher, ie next to the next lowest) designated intensity, the fourth level sensing means providing a signal indicating whether the intensity of the input signal is greater than a fourth (next higher) designated intensity, and so on to the last level sensing means providing a signal indicating whether the intensity of the input signal is greater than a last (highest) designated intensity;

means for directing a predetermined portion of the threshold signals from the first and second level sensing means to first exclusive-or gate (XOR) means, directing a predetermined portion of the threshold signals from the second and third level sensing means to second XOR means, directing a predetermined portion of the threshold signals from the third and fourth level sensing means to third XOR means, and so on, directing a predetermined portion of the threshold signals from the next-to-last and last level sensing means to a last XOR means (in number one less than that of the last level sensing means);

each XOR means comprising means for providing a first binary optical signal (indicating inequality) of a third predetermined intensity within a third predetermined range of intensities when one of the threshold signals directed to it has the first predetermined intensity and the other threshold signal directed to it has the second predetermined intensity, and for providing a second binary optical signal (indicating equality) of a fourth predetermined intensity within a fourth predetermined range of intensities substantially separated from the third range when both of the threshold signals directed to it have the first predetermined intensity and when both of the threshold signals directed to it have the second predetermined intensity; and means for directing the digital optical signal from each XOR means to at least one of a plurality of individual optical output means according to a designated digital coding system, whereby each available combination of signals in the plurality of individual output means provides a digital indication of the specific range of optical intensities within which is the intensity of the analog optical input signal.

4. Apparatus as in claim 3, comprising also means for directing a predetermined portion of the threshold signal from the last level sensing means to an additional individual optical output means for providing an indication that the intensity of the analog optical input signal is greater than the last (highest) designated intensity.

5. Apparatus as in claim 3, comprising also means for receiving an analog electrical signal and providing an analog optical signal having an intensity that is a monotonic function of the magnitude thereof as the input signal to the input directing means.

6. Apparatus as in claim 3, comprising also means responsive to each individual optical output means for providing an electrical signal indicating the level of intensity of the light received from each XOR means.

7. Apparatus as in claim 3, wherein the path along which the analog input signal is directed comprises channel waveguide means.

8. Apparatus as in claim 3, wherein the intensity of the analog input signal decreases monotonically as it travels along the path, and the level sensing means comprise a series of threshold gate means spaced apart along the path and each having substantially the same threshold level.

9. Apparatus as in claim 3, wherein the level sensing means comprise nonlinear waveguide threshold gate means.

10. Apparatus as in claim 3, wherein the XOR means comprise single-mode channel waveguide XOR gate means.

11. Apparatus as in claim 3, wherein the path along which the analog input signal is directed comprises channel waveguide means and a plurality of evanescent coupler means.

12. Apparatus as in claim 3, wherein each means for directing a portion of a threshold signal comprises beam splitting means.

13. Apparatus as in claim 3, wherein all of the directing means include channel waveguide means.

14. Apparatus as in claim 3, wherein the level sensing means comprise threshold gate means with orthogonal channels.

15. Apparatus as in claim 3, wherein the XOR means comprise waveguide XOR gate means having negative nonlinearity.

16. Apparatus as in claim 3, wherein the XOR means comprise waveguide XOR gate means having positive nonlinearity.

* * * * *